United States Patent [19]

Mahneke

[11] Patent Number: 5,916,631
[45] Date of Patent: Jun. 29, 1999

[54] METHOD AND APPARATUS FOR SPIN-COATING CHEMICALS

[75] Inventor: Peter Mahneke, Buchholz, Germany

[73] Assignee: The Fairchild Corporation, Dulles, Va.

[21] Appl. No.: 08/866,834

[22] Filed: May 30, 1997

[51] Int. Cl.[6] .................................................. B05D 3/12
[52] U.S. Cl. ..................... 427/240; 427/336; 427/385.5; 118/52; 437/231
[58] Field of Search ............................... 427/240, 385.5, 427/336; 118/52; 437/231

[56] References Cited

U.S. PATENT DOCUMENTS

| | | | |
|---|---|---|---|
| 2,632,725 | 3/1953 | Marks et al. | 154/128 |
| 4,031,852 | 6/1977 | Clarke et al. | 118/52 |
| 4,068,019 | 1/1978 | Boeckl | 427/82 |
| 4,075,974 | 2/1978 | Plows et al. | 118/52 |
| 4,086,870 | 5/1978 | Canavello et al. | 118/52 |
| 4,587,139 | 5/1986 | Hagan et al. | 427/130 |
| 4,775,550 | 10/1988 | Chu et al. | 427/38 |
| 4,838,979 | 6/1989 | Nishida et al. | 156/345 |
| 4,889,069 | 12/1989 | Kawakami | 118/50 |
| 5,003,062 | 3/1991 | Yen | 437/231 |
| 5,013,586 | 5/1991 | Cavazza | 427/240 |
| 5,439,519 | 8/1995 | Sago et al. | 118/52 |
| 5,626,675 | 5/1997 | Sakamoto et al. | 118/663 |
| 5,660,634 | 8/1997 | Fujiyama et al. | 119/319 |
| 5,705,223 | 1/1998 | Bunkofske | 427/24 |

FOREIGN PATENT DOCUMENTS 60-143871  7/1985  Japan .
62-185321  8/1987  Japan .

OTHER PUBLICATIONS

Patent Abstracts of Japan, vol. 095, No. 009, Oct. 31, 1995 & JP. 07 142378 A; (Tokyo Electron Ltd; Others: 01), Jun. 2, 1995.

Patent Abstracts of Japan, vol. 013, No. 275 (C–610), Jun. 23, 1989 & JP 01 070168 A (Hitachi Ltd.), Mar. 15, 1989.

Patent Abstracts of Japan, vol. 013, No. 024 (C–561), Jan. 19, 1989 & JP 63 229169 A (Hitachi Ltd.), Sep. 26, 1988.

Patent Abstracts of Japan, vol. 097, No. 002, Feb. 28, 1997 & JP 08 273996 A (NEC Kansai Ltd.), Oct. 18, 1996.

Patent Abstracts of Japan, vol. 097, No. 005, May 30, 1997 & JP 09 007918 A (M Setetsuku KK), Jan. 10, 1997.

*Primary Examiner*—Janyce Bell
*Attorney, Agent, or Firm*—Hickman & Martine, LLP

[57] ABSTRACT

Disclosed is an apparatus and a method for spin coating chemicals over a surface of a substrate. The apparatus includes a bowl for supporting a substrate, the bowl has a plurality of drain holes defined below the level of the substrate. The apparatus further includes a lid having a flat surface configured to lie a predetermined distance above the substrate and mate with the bowl. Further, a plurality of injection holes defined in the bowl for applying a solvent to an underside of the substrate are included. The plurality of injection holes are defined in along an injection ring that is configured to receive the liquid solvent that is to be applied near an outer radius of the underside of the substrate, and the injection ring is spaced apart from the underside of the substrate.

26 Claims, 9 Drawing Sheets

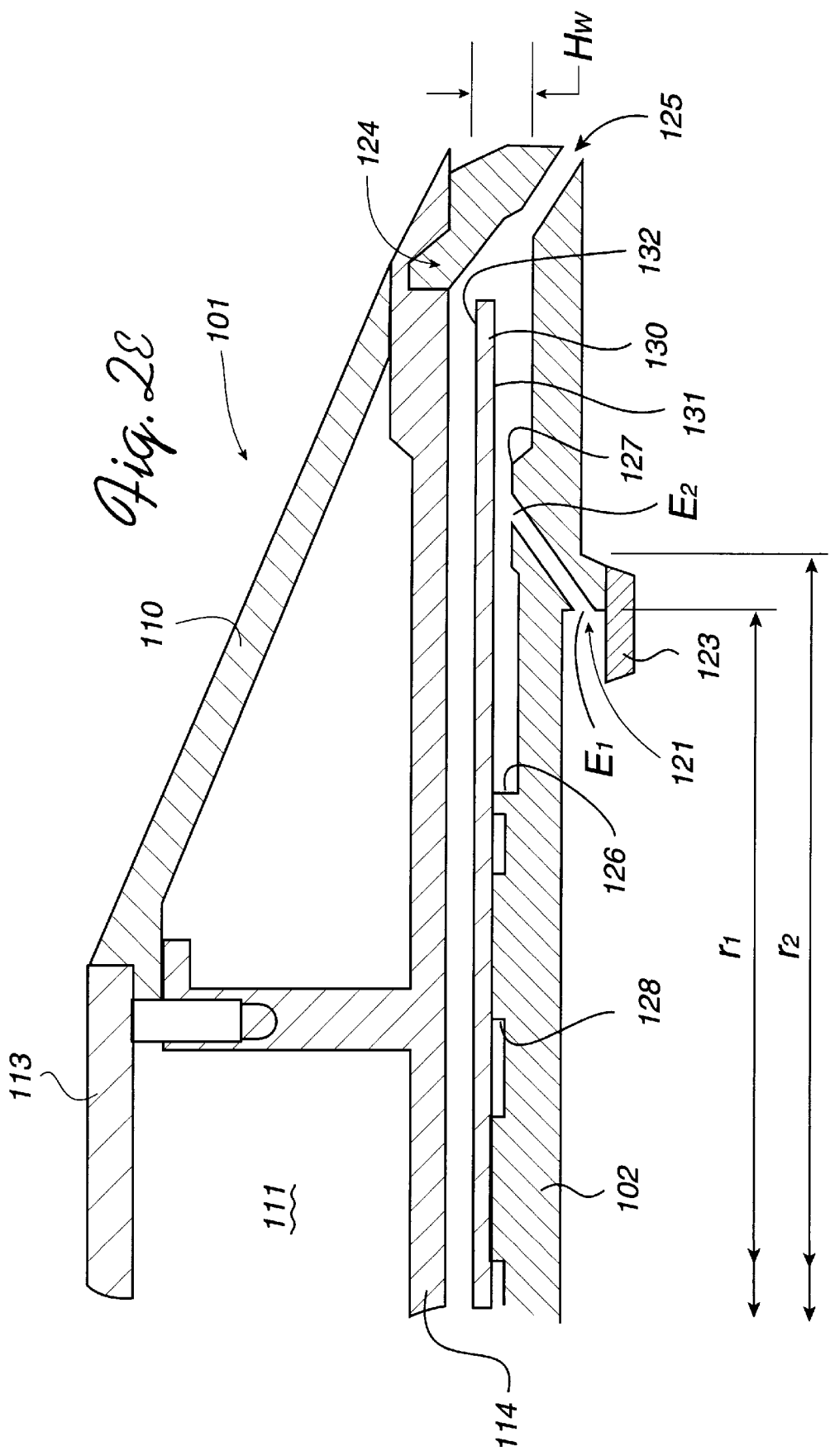

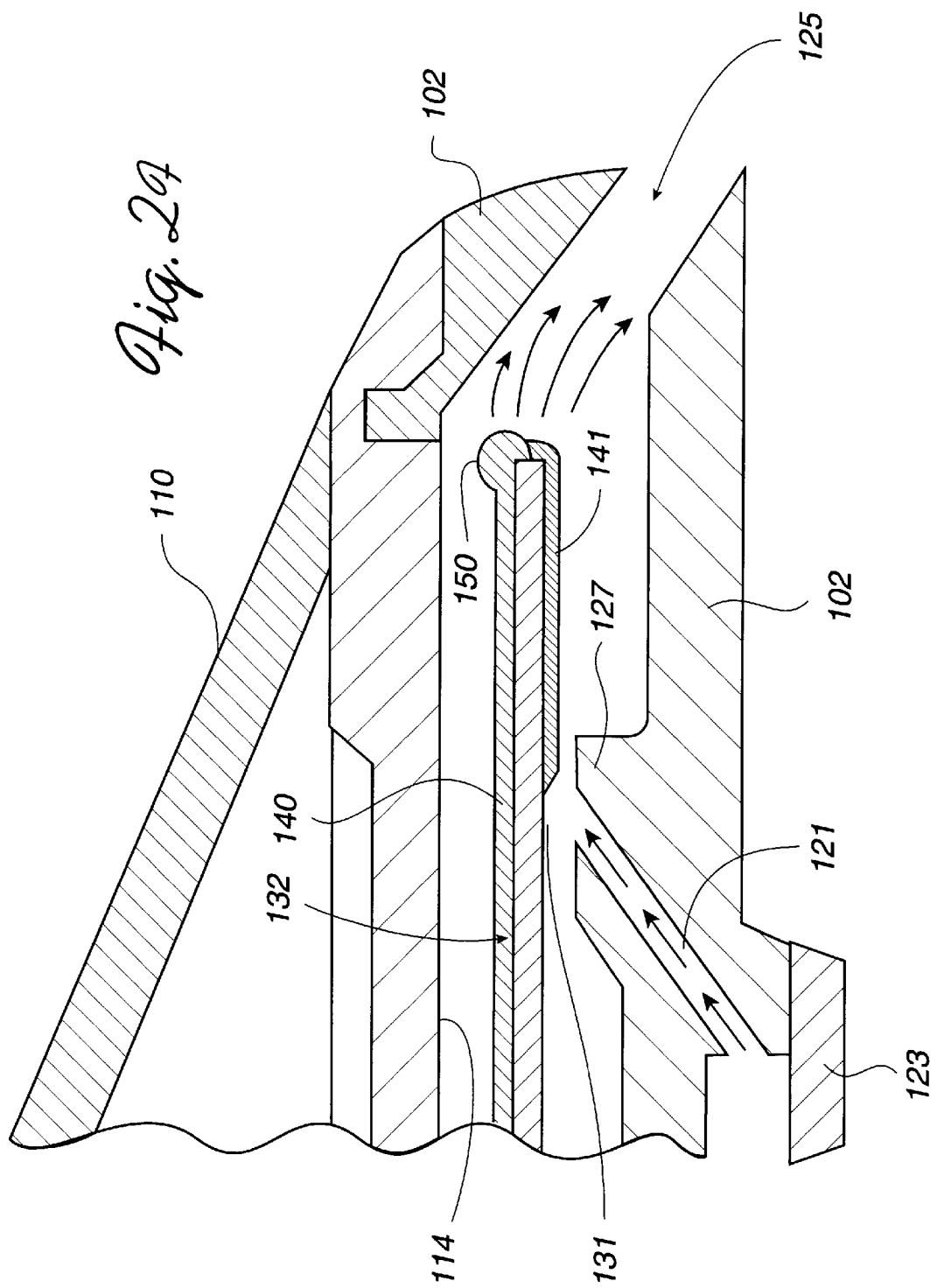

METHOD AND APPARATUS FOR SPIN-COATING CHEMICALS

CROSS REFERENCE TO RELATED APPLICATIONS

This application is related to U.S. patent application Ser. No. 08/866,832, filed on the same day as the instant application, and entitled "Apparatus and Method for Spin-Coating Substrates." This application is hereby incorporated by reference.

BACKGROUND OF THE INVENTION

1. Field of the Invention

The present invention relates generally to semiconductor fabrication, and more particularly, to apparatuses and methods for uniformly spin-coating chemicals over substrates used in the fabrication of semiconductor devices.

2. Description of the Related Art

The fabrication of a large variety of solid state devices such as semiconductors requires the use of planar substrates, otherwise known to those skilled in the art as wafers. An important consideration in the fabrication of these devices is the final number (i.e., yield) of functional dies remaining from each manufactured wafer. The functional dies are packaged, undergo testing (both electrical and otherwise), and substantially all of the packaged dies that pass the requisite testing are sold. It is therefore of utmost importance for manufacturers of these products to take advantage of economies of scale realized by increasing their production yield. Typically, depending on the individual die dimensions, upwards of 1000 or more dies may be fabricated on a single wafer. These wafers are typically on the order of six to twelve inches in diameter.

A typical fabrication process requires numerous steps, where several layers of material are cumulatively applied and patterned on the surface of the wafer. Once complete, these layers form the desired semiconductor structure necessary for the resulting circuit, or device. As can be appreciated, the final functional yield critically depends upon the proper application of each layer during the various process steps. Proper application of these layers typically depends, in turn, upon the ability to form uniform coatings of material on the surface of the wafer in an efficient, environmentally benign, and production worthy manner.

Various fabrication process steps implemented in making semiconductor devices utilize photolithography to define the desired patterns on the surface of a wafer. As is well known, photolithography is the process where light energy is applied through a reticle mask (using a stepper exposure camara) onto a photoresist material that is applied to the wafer to define patterns where subsequent etching will occur. These surface patterns represent a two dimensional layout of the desired structure that is fabricated on the surface of the wafer. It is therefore important that the photoresist material be applied in uniformly distributed coatings.

Conventionally, the application of photoresist coatings on the surface of a wafer is accomplished by casting a photoresist fluid on a wafer that is spinning at high speeds within a stationary exhausted bowl. In general, the stationary exhausted bowl is used to catch any excess fluids and remove particulates. Once the photoresist fluid is applied, the centrifugal force that result from the high rotational speed of the wafer overcomes the surface tension of the photoresist fluid, which causes the photoresist fluid to spread over the surface of the wafer.

A side effect of spinning the wafer is the inducement of air flows in the air immediately above and adjacent to the wafer surface. Unfortunately, this air flow tends to induce particles of photoresist to leave the wafer surface at the wafer's edge. When the photoresist leaves the wafer's edge, the free floating photoresist particulates have the potential to back contaminate the remainder of the wafer surface where a fresh coating of photoresist has just been applied. Although these particles may be removed by an exhaust system that may be part of the stationary bowl, the exhaust has the undesirable effect of drying out photoresist solvent films unevenly and, thus, producing a non-uniform coating of photoresist over the surface of the wafer during the spinning process. Back side contamination of the photoresist film with photoresist particulates and uneven drying of the photoresist film are therefore, undesirable yield reducing side effects of conventional spin-coating processes.

Another problem associated with conventional spin coating methods is photoresist fluid beading at the outer edge of the spinning wafer. Specifically, it is believed that surface tension and adhesion of the photoresist film to the wafer surface experienced during spinning causes the photoresist to from a "zone of increased thickness" at the edge of the wafer. This beading can typically contribute to a significant loss in functional devices that lie at and near the outer edge of the wafer.

Yet another problem associated with the beading effect at the edges of the wafers is that wafers are commonly stored in cassettes and, the increased thickness at the edges has the unfortunate effect of fracturing the wafers when they come in contact with the storage cassette. Of course, when wafers are fractured in any way, an instant loss in yield is experienced.

FIG. 1 is an illustration of a conventional open bowl apparatus 10 for spin coating a wafer 16. A wafer 16 is typically placed upon a rotatable chuck 14 which is rigidly connected to a spinning motor unit 20 by a shaft 18. As shown, the spinning chuck 14 and the wafer 16 are located within an open stationary bowl 12. The open stationary bowl 12 may include suitable exhaust passages 22 that are used to purge out particulates that may be produced within open stationary bowl 12 during a spin coating operation. During a spin coating operation, a number of air flows 17 may be produced in the air immediately above and adjacent to the spinning chuck 16. As described above, the air flows 17 tend to produce topographical variations in the applied coatings that unfortunately reduce yield.

In view of the foregoing, there is a need for apparatuses and methods that facilitate the application of substantially uniform spin coated materials over the surface of a wafer.

SUMMARY OF THE INVENTION

Broadly speaking, the present invention fills these needs by providing methods and apparatuses for uniformly spin-coating materials over the surface of wafers. It should be appreciated that the present invention can be implemented in numerous ways, including as a process, an apparatus, a system, a device, or a method. Several inventive embodiments of the present invention are described below.

In one embodiment, an apparatus for spin coating chemicals over a surface of a substrate is disclosed. The apparatus includes a bowl for supporting a substrate, the bowl has a plurality of drain holes defined below the level of the substrate. The apparatus further includes a lid having a flat surface configured to lie at a predetermined distance above the substrate and mate with the bowl. Further, a plurality of injection holes are located under the bowl for applying a solvent to an underside of the substrate. The plurality of injection holes are located adjacent to a solvent injection ring that is configured to receive the liquid solvent applied from the outside of the bowl and driven into the bowl by centrifugal force to an outer radius of the underside of the substrate. The applied liquid solvent is configured to substantially reduce beading at an edge of the substrate and rinse off particulates that may be on the underside of the substrate.

In another embodiment, an apparatus for spin coating a workpiece is disclosed. The apparatus includes a bowl for holding the work piece and a lid mounted on a top surface of the bowl. A plurality of lower drain holes are preferably defined along an outer circumference of bowl. A plurality of injecting holes each have a first end located on the outer lower surface of the bowl, and each of the plurality of injecting holes have a corresponding second end located on an inner surface of the bowl, such that the first end and second end are connected to define a path. Further, the plurality of injection holes are located at a first radial distance that is less than a second radial distance of the second end of the plurality of injection holes.

In yet another embodiment, a method for spin coating a chemical over a substrate is disclosed. The method includes applying a chemical over a substrate and enclosing the substrate in a closed bowl configured to hold the substrate. The method also includes spinning the closed bowl to cause the chemical to spread over a top surface of the substrate. Then, injecting a solvent into the closed bowl such that the injected solvent is applied at an under surface of the substrate while the closed bowl is spinning, the injected solvent being configured to reduce edge beading of the chemical applied over the substrate and to rinse off particulates which may collect on the underside of the wafer. In addition, the solvent advantageously cleans the interior of the bowl by rinsing waste resist and chemicals from the interior of the bowl.

Advantageously, the apparatus lid is configured to enclose the wafer and seal out the environment above the wafer surface during a spin coating process. The plurality of injection holes defined through the underside of the spinning bowl are well suited for applying a fluid solvent to the underside of the wafer, and thereby rinse the underside of the wafer to suppress edge beading. In the preferred embodiment, the plurality of injection holes are located in a ring that is well suited to receive the fluid solvent that is applied to the outside of the spinning bowl. The applied fluid solvent is driven by the spinning centrifugal force through the holes and up onto the backside of the wafer. The solvent fluid is then driven by the centrifugal force to the edge of the wafer rinsing both the underside of the wafer, the edge of the wafer and the inner regions of the bowl. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings:

FIG. 2E is an enlarged side view of a portion of a rotatable bowl having a fluid drain hole in accordance with one embodiment of the present invention.

FIG. 2F is a diagrammatic cross-sectional view of a wafer during a typical spin coat cycle in accordance with one embodiment of the present invention.

FIG. 2G is a cross sectional view of a wafer having a substantially uniform coating layer after a spin coating procedure in accordance with one embodiment of the present invention.

DETAILED DESCRIPTION OF THE PREFERRED EMBODIMENTS

Figure 1:
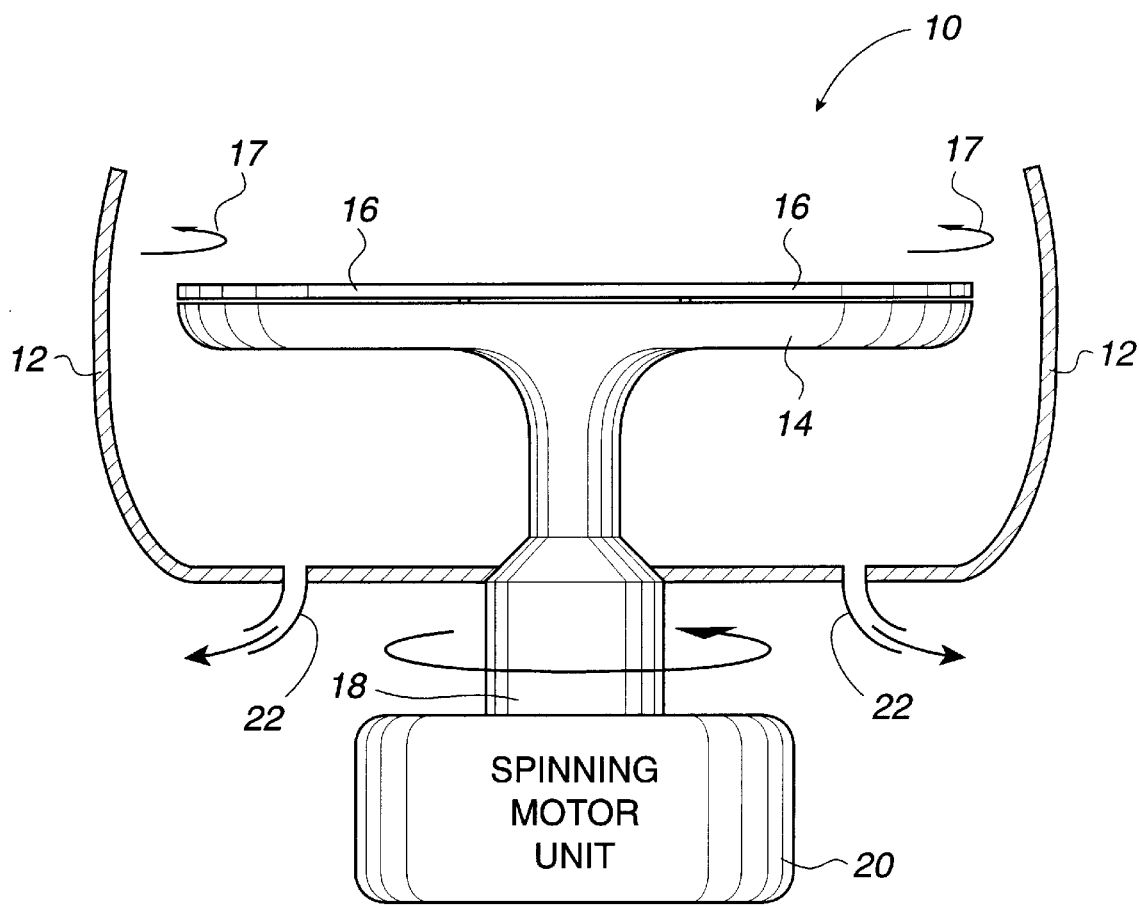
FIG. 1 is a cross-sectional view of a substrate spin coated in a conventional open bowl arrangement.

An invention for a closed semiconductor process bowl that provides improved spin coat uniformity is disclosed. Although the present invention is particularly well suited for the application of photoresist materials, other chemicals such as spin-on-glass (SOG) may also find the application process well suited to improve coating uniformity. The various embodiments of the present invention may be implemented in any form, and may find particular use in the application of both high viscosity and lower viscosity materials to the surface of a planar wafer. In the following description, numerous specific details are set forth in order to provide a thorough understanding of the present invention. It will be obvious, however, to one skilled in the art, that the present invention may be practiced without some or all of these specific details. In other instances, well known process operations have not been described in detail in order not to unnecessarily obscure the present invention.

In accordance with one embodiment, a closed process bowl is disclosed where chemicals are spin coated over a substrate during a fabrication process. In a preferred embodiment, the substrate is a wafer that may be used to make semiconductor devices. Generally, the wafer is placed on a rotatable bowl that is rigidly affixed to a motor driven shaft. During the coating process, a chemical such as photoresist is applied to the surface of the wafer before a lid is secured to the rotatable bowl having curved walls. The spinning of the bowl causes the chemical to spread over the surface of the wafer.

To combat the aforementioned edge beading problems, a solvent is preferably injected on the back side (i.e., back side rinse) of the spinning wafer near its outer diameter after the photoresist has spread over the surface of the wafer. Preferably, the solvent is injected through a plurality of solvent injector holes that extend from an outer surface of the rotatable bowl to an interior region of the rotatable bowl. When applied, the solvent is forced into the rotatable bowl by the centrifugal force produced by the spinning action. In one embodiment, the applied solvent acts to substantially reduce beading at the outer regions of the wafer. Further, the applied solvent also acts to reduce particle contamination to the under surface of the wafer.

Any dissolved material and excess solvent is generally removed from the closed bowl system through drain holes that are located at an outer diameter edge of the bowl. In manner, the dissolved material and excess solvent generally flows out of the closed bowl system during the photoresist coating operation and the back side rinse operation used to prevent edge bead formation. Once the back side rinse operation is complete, a top side rinse operation may also be performed. In general, the top side rinse operation involves removing the lid of the closed bowl system and applying a solvent over the top of the resist coated wafer.

Preferably, the bowl containing the coated wafer is spun while the solvent is applied to the surface of the wafer to complete the top side rinse. Any solvent chemicals that spin off of the surface of the wafer while the bowl is spinning (and when the bowl comes to rest) are therefore allowed to exit the bowl through the aforementioned drain holes that are positioned below the surface height of the wafer. The back side rinse and top side rinse operations have the advantageous effect of cleaning the inner regions of the bowl of excess photoresist in addition to providing superior edge bead removal in a controlled environment.

Figure 2A:
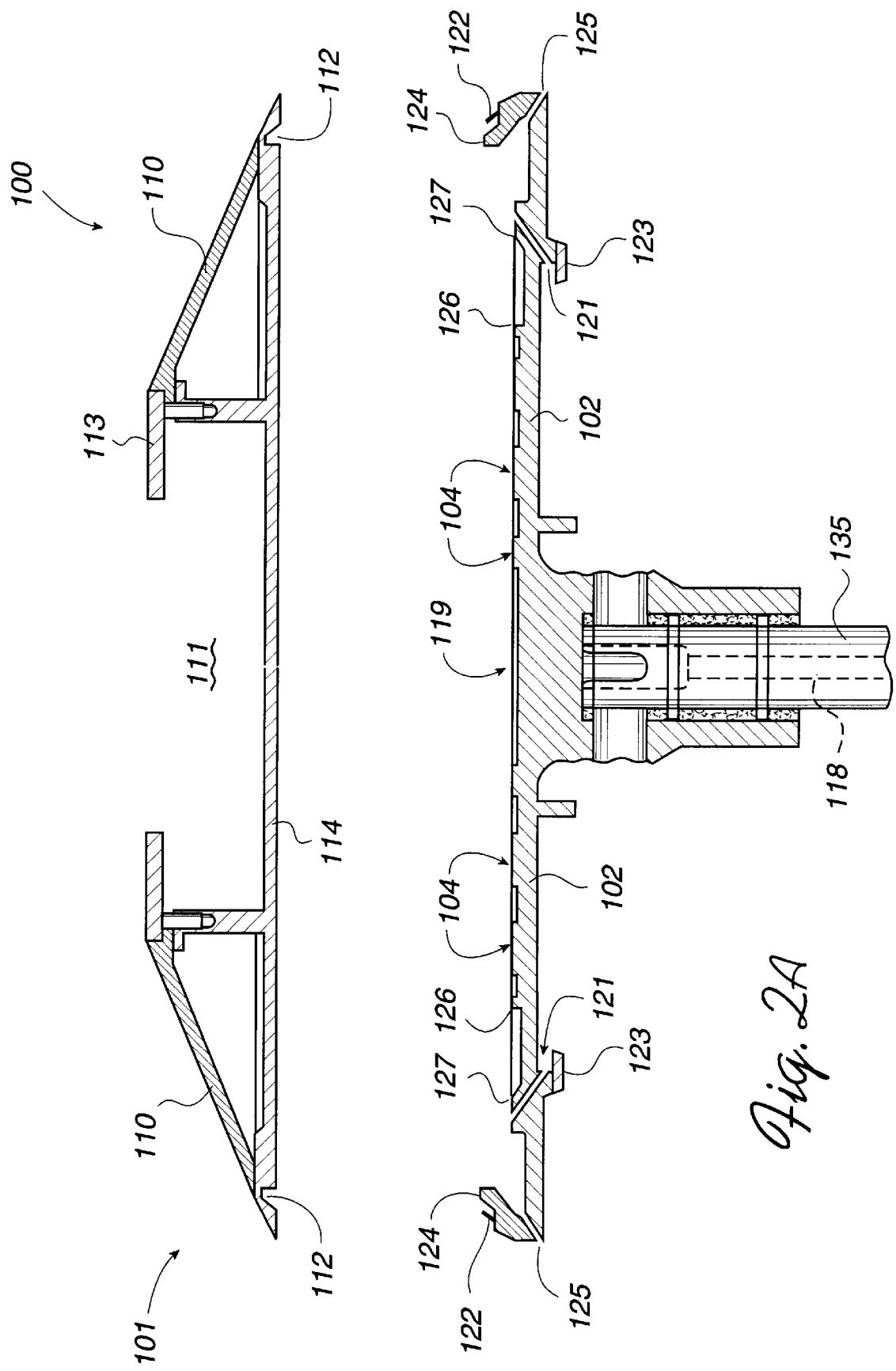
FIG. 2A is an exploded view of a rotatable bowl and a lid in accordance with one embodiment of the present invention.

FIG. 2A is an exploded view of a closed semiconductor process system 100 including a bowl 102 and a lid 101. In this embodiment, the lid 101 preferably has a circular shape having an upper beveled surface 110, a lower flat surface 114, and a hollow internal region 111 that is accessible through a top opening 113. In accordance with the present embodiment, the bowl 102 is integrally connected to a motor driven axial shaft 135. As shown, the axial shaft 135 has an axially located vacuum chamber 118 extending substantially along the length of axial shaft 135 and terminating in a vacuum orifice 119. Vacuum orifice 119 is preferably centrally located on a support surface 104 of bowl 102.

As shown, support surface 104 of bowl 102 is preferably configured to hold a suitable workpiece. In a preferred embodiment, the work piece is a silicon wafer used in the fabrication of semiconductor integrated circuits. However, it should be appreciated that the various embodiments of the present invention may be equally applicable to other technologies where precision chemical spin-coating is desirable (i.e., photoresist, spin-on-glass (SOG), compact disc recordable (CDR) dye chemicals, etc.). Generally, a support ring 126 defines the outer circumference of support surface 104 of bowl 102 and is configured to support a wafer 130, as shown in FIG. 2C. In this example, lid 101 will preferably have a circular recessed groove 112 defined in the lower flat surface 114. Circular recessed groove 112 is preferably configured to mate with a circular protruded lip 124 that is located around the outer wall portions of bowl 102.

Also shown are a plurality of drain holes 125 that are arranged at the outer radius of bowl 102. Preferably, drain holes 125 are vertically lower than support surface 104. In this manner, when wafer 130 is placed over support surface 104, the wafer lies above drain holes 125. Because chemicals that are applied to the surface of a spinning wafer slide off of the wafer at high rates, the chemicals will preferably be channeled down and along the curved walls to the drain holes 125. As such, this curved wall surface is well suited to receive the chemicals being released from the wafer surface in a manner that directs the chemicals out of the closed bowl system. Preferably, between about 8 and about 16 drain holes 125 are defined around the outer radius of bowl 102 to enable the applied chemicals to exit during a spin coating cycle. In this embodiment, drain holes 125 are between about 1 mm and about 3 mm in diameter. Of course, the diameter may be modified to suit depending on the viscosity of the applied chemicals and the solvent materials injected in through injection holes 121. In any event, drain holes 125 are generally large enough to ensure that a sufficient pathway is defined to drain out the injected solvent and dissolved coating materials.

Figure 2B:
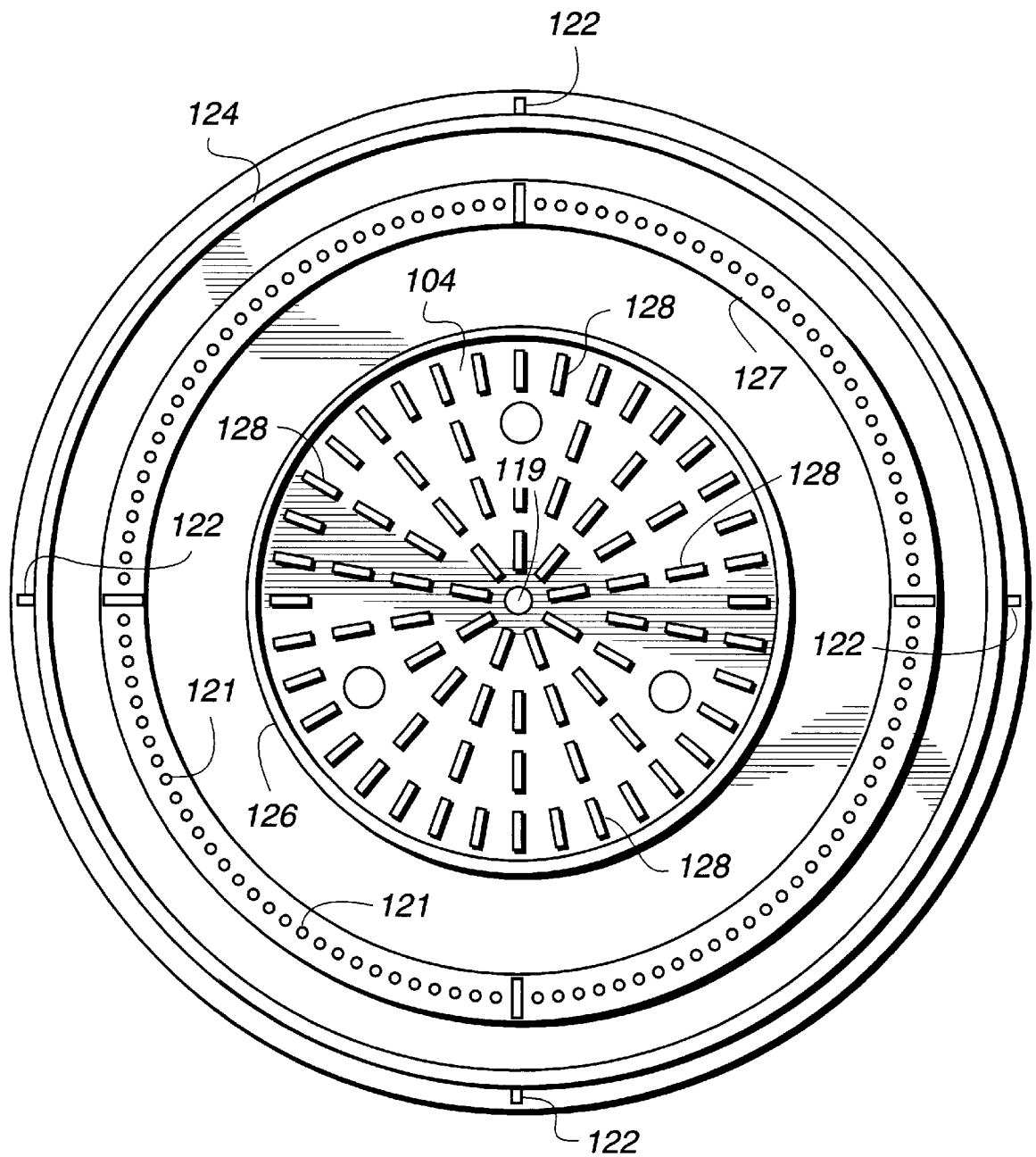
FIG. 2B is a top view of a rotatable bowl in accordance with one embodiment of the present invention.
Figure 2C:
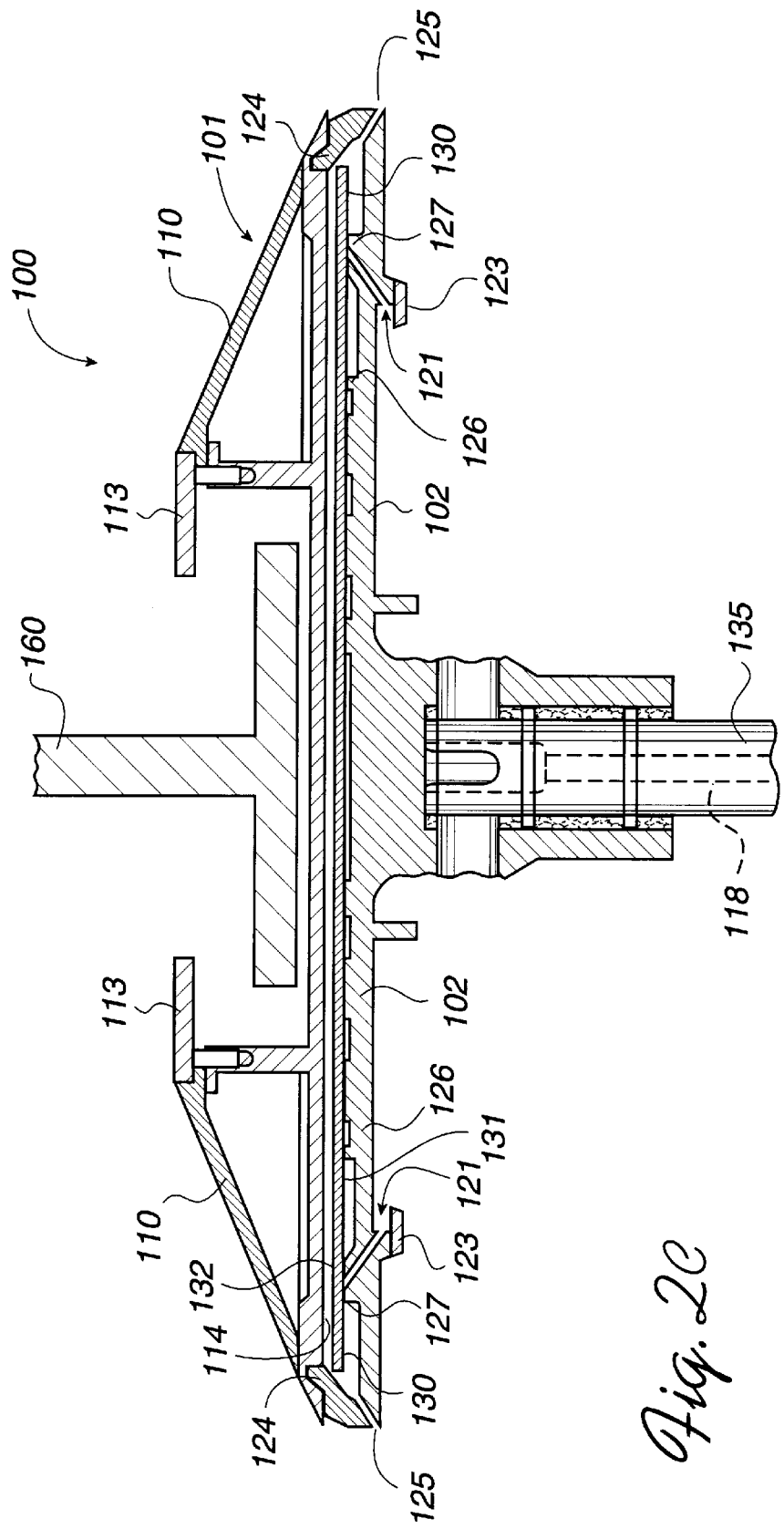
FIG. 2C is a cross-sectional view showing the rotatable bowl containing a wafer and a locking shaft for mechanically applying and removing the lid to the rotatable bowl in accordance with one embodiment of the present invention.
Figure 2D:
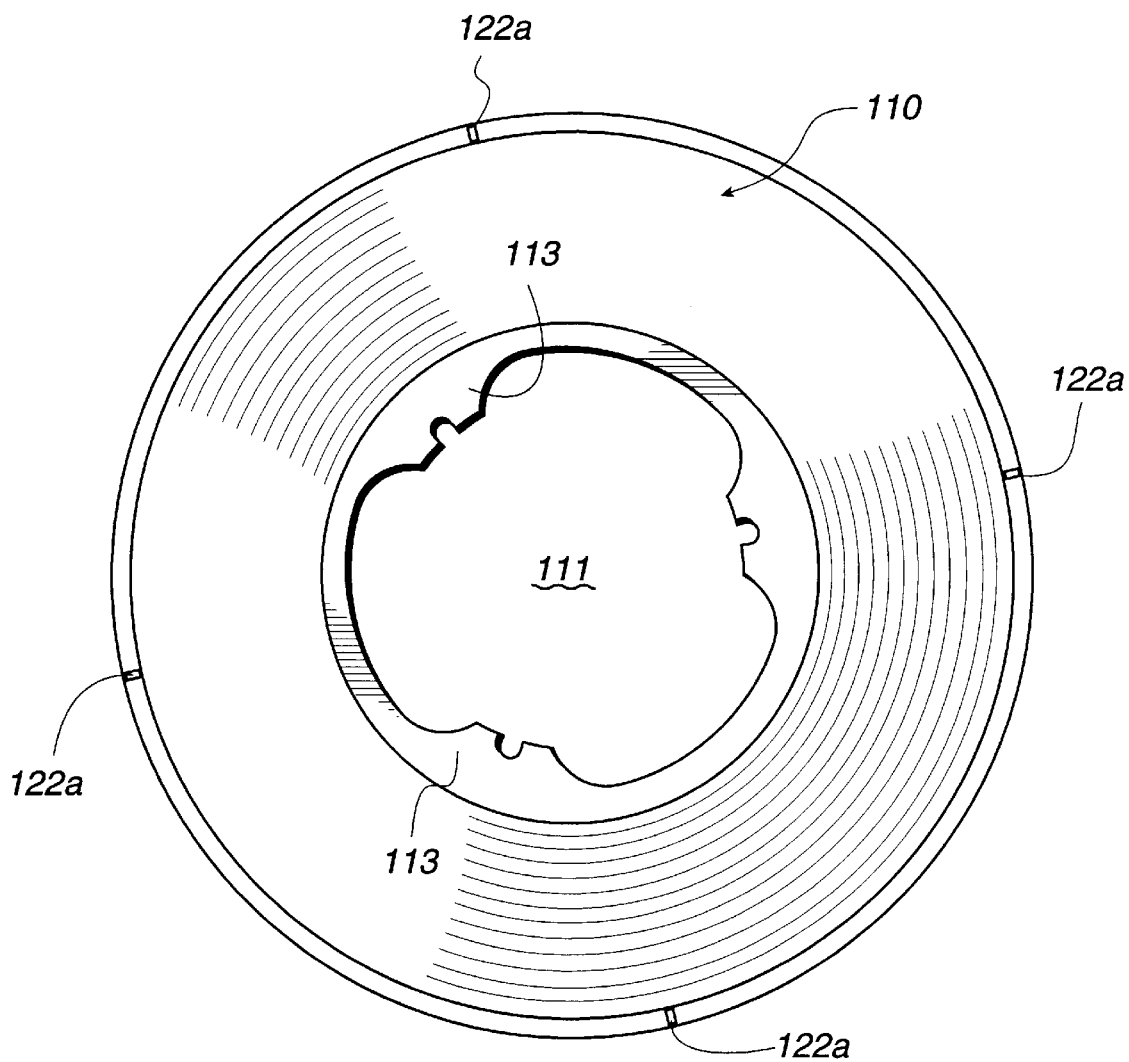
FIG. 2D is a top view of the lid used in accordance with one embodiment of the present invention.
Figure 29:
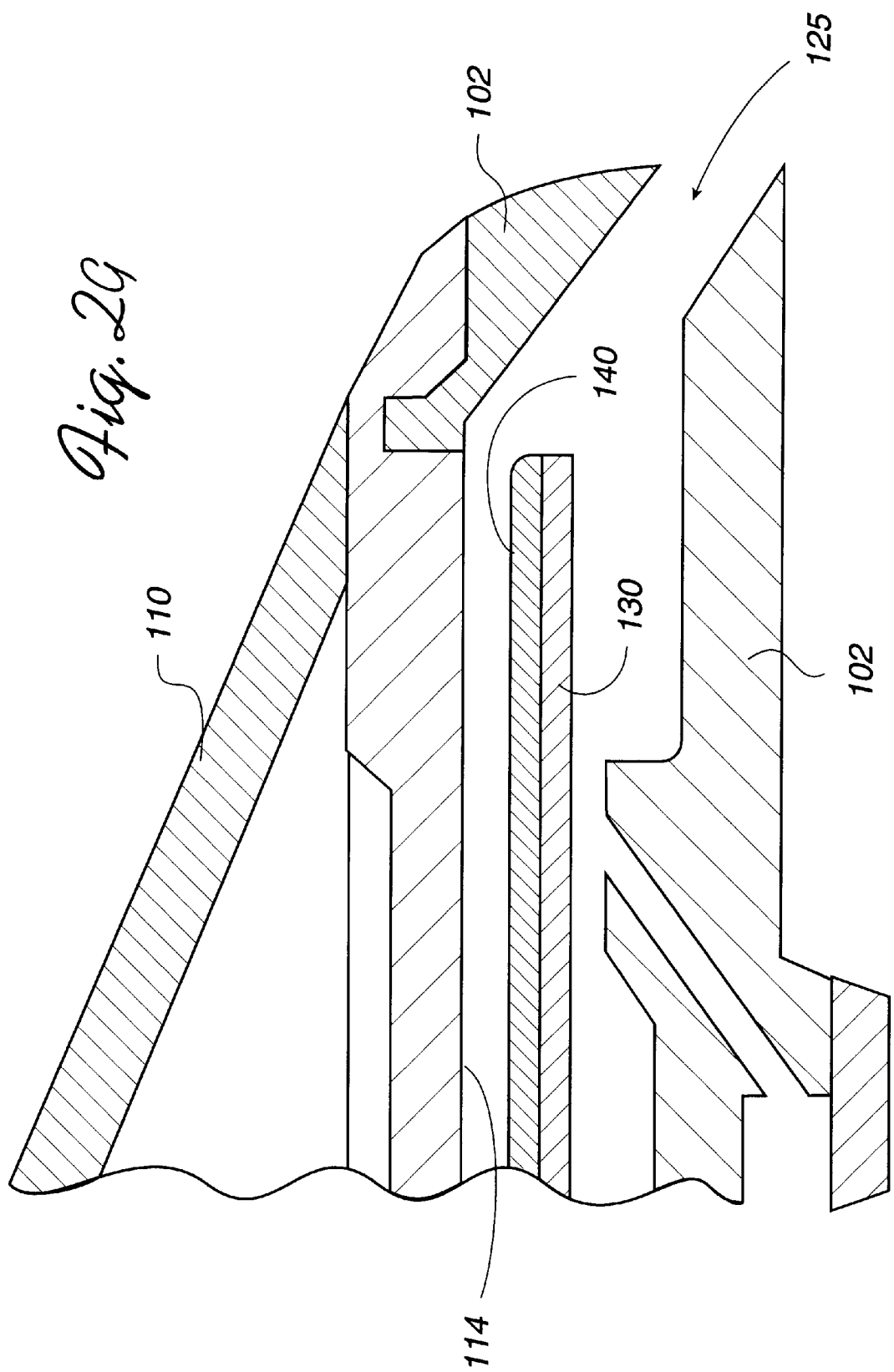

FIG. 2B is a top view of bowl 102 in accordance with one embodiment of the present invention. As shown, support surface 104 of bowl 102 has a plurality of supports 128 that extend radially outward from the centrally located vacuum orifice 119 to the support ring 126. Supports 128 are used to support the substrate that is held in place by vacuum suction supplied by vacuum orifice 119 and vacuum chamber 118. A plurality of locking pins 122 are shown arranged around the top portion of bowl 102 to assist in securing lid 101 to bowl 102. Generally, locking pins 122 are configured to mate with suitable recessed pin holes 122a located on lid 101 as shown in FIG. 2D below. Of course, other suitable lid attachment techniques will work as well. This view also provides a good illustration of a plurality of solvent injector holes 121 that are defined on a solvent ejector ring 127. In one embodiment, about 100 solvent injection holes 121 are defined around the solvent ejector ring 127 for applying solvent chemicals used in back side rinse operations. The back rinse function of solvent injector holes 121 will be described in greater detail with reference to FIG. 2E.

FIG. 2C shows a wafer 130 placed upon support surface 104 of bowl 102 in accordance with one embodiment of the present invention. As described above, a vacuum supplied by a vacuum pump (not shown) is coupled to the vacuum chamber 118 which leads to the support surface 104 for securing wafer 130 during operation. In this view, the lid 101 has been coupled to bowl 102 in order to encapsulate wafer 130. Preferably, the lower flat surface 114 of lid 101 is separated from the upper surface 132 of wafer 130 by a distance that is small enough to reduce convective vortices from forming near the surface lying above the spinning wafer. In one embodiment, the distance is between about 1 mm and about 10 mm, and more preferably, between about 1.5 mm and about 3 mm, and most preferably about 2 mm.

During a spin coating operation, a coating material is preferably applied to the inner radius of the upper surface 132 of wafer 130 before lid 101 is secured to the bowl 102. After the coating material has been applied, lid 101 is secured to bowl 102 by mating circular recessed groove 112 to circular protruded lip 124 as described above. In one embodiment, axial shaft 135 is connected to a motor (not shown) that preferably rotates axial shaft 135 to operational speeds sufficient to spread the coating materials.

To ensure that lid 101 remains secured to bowl 102 during rotation, a locking shaft 160 is secured to lid 101. In addition, locking shaft 160 is used to mechanically apply and remove lid 101 from bowl 102 during and between spin coating cycles. As shown by FIG. 2D, opening 113 defines a shape that is configured to receive locking shaft 160 (having a similar shape) into hollow internal region 111. Once the locking shaft 160 is lowered into hollow internal region 111, locking shaft 160 is rotated approximately 120 degrees in either direction. In this manner, the now opposing shapes of the locking shaft 160 and opening 113 prevent lid 101 from detaching during spin coating. From this top view of lid 101, the plurality of recessed pin holes 122a are shown defined along the outer diameter of lid 101 such that the plurality of pins 122 illustrated in FIGS. 2A and 2B mate with the plurality of pin holes 122a.

As described above and illustrated in FIG. 2E, bowl 102 includes a plurality of solvent injection holes 121. Solvent injection holes 121 have one end $E_1$ defined within a solvent injector ring 123 that is located a radial distance $r_1$ from the center of rotation of bowl 102. Further, an internal end $E_2$ of the solvent injection holes 121 is located at about a radial distance $r_2$ from the center of rotation of bowl 102. Generally, radial distance $r_1$ is less than radial distance $r_2$, therefore the injector holes 121 form angled conduit paths (e.g., between about 30 and 50 degrees) through bowl 102, connecting solvent injector ring 123 and solvent ejector ring 127. In a preferred embodiment, solvent ejector ring 127 has a diameter that extends about 150 mm. As described above, solvent that is passed in through the injector holes are well suited to complete back side rinsing of wafer 130, thereby reducing the possibility of edge bead formation.

It should also be appreciated that wafer 130 is positioned a distance "Hw" above drain holes 125. In one embodiment, the distance Hw is at least between about 3 mm and about 5 mm, and more preferably at least between about 3 mm and about 4 mm, and most preferably at least about 3 mm. In this manner, chemicals that are spun off of the surface of wafer 130 are preferably not reflected back onto the surface of wafer 130. As described above, the inner wall surface of bowl 102 is preferably curved enough to allow chemicals to slide off wafer 130 and down the wall surface toward drain holes 125. A further advantage of having the drain holes 125 below the top surface 132 of wafer 130 is that any turbulence flows produced near the inner edge of bowl 102 is preferably contained below wafer 130. When turbulent flows are directed away from the surfaced wafer 130, the spun on coatings are produced with improved uniformity, thereby reducing yield reducing imperfections.

FIG. 2F shows a cross sectional view of wafer 130 during a typical spin coat procedure. As bowl 102 rotates, the produced centrifugal forces assist the coating material in spreading over the surface 132 of wafer 130, thereby forming a coating layer 140. Unfortunately, the typical coating procedure produces a beading 150 at the edge of wafer 130. As described above, beading 150 presents a number of undesirable yield reducing problems. To reduce the possibility of beading 150, a solvent material is injected in through solvent injector 121 and applied as a temporary solvent coating 141. In this example, the solvent coating 141 is caused to spread out towards the beading 150 by the same centrifugal forces that spread coating layer 140. Accordingly, the solvent coating 141 assists in dissolving beading 150 to produce a more uniformly coated edge. The dissolved coating material and excess solvent will then flow out of bowl 102 through drain holes 125 as described above. FIG. 2G is a diagrammatic cross sectional view of wafer 130 having the spun on coating material layer 140 after the solvent coating 141 was applied to remove beading 150. As shown, the coating layer 140 is now more uniform throughout the surface of wafer 130.

Figure 3:
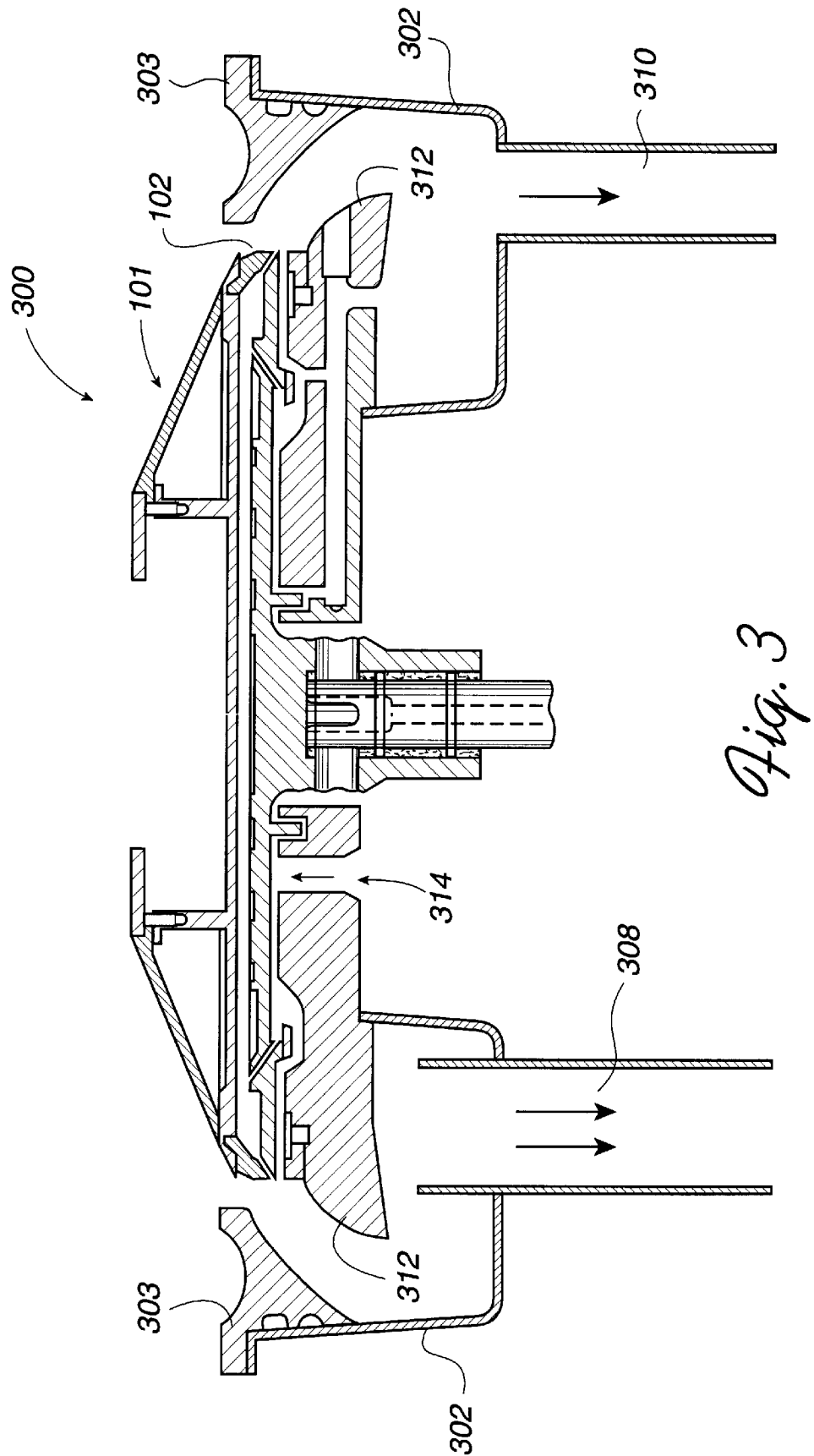
FIGS. 3 illustrates an exemplary spin coating system including a catch cup in accordance with one embodiment of the present invention.

FIGS. 3 illustrates an exemplary spin coating system 300 that may be used in conjunction with the closed bowl spin coating system described above. As shown, bowl 102 and lid 101 are preferably assembled within a catch cup 302. Catch cup 302 may include a splash ring 303 that is used to block particulates generated out of drain holes 125 from exiting catch cup 302. Catch cup 302 also includes a drain hole 310 that is well suited to channel chemicals out of catch cup 302 and into a drain manifold (not shown). An exhaust manifold 308 may also be provided to assist in the removal of air borne particulates. A HEPA filter (not shown) may also be positioned above spin coating system 300 to capture any particulates that may escape catch cup 302. In the embodiment shown, a plenum 312 is coupled to bowl 102 to provide a channel 314 used for applying the aforementioned solvent chemicals to the solvent injector holes 121. In addition, plenum 312 provides a surface for receiving the exhaust manifold 308. Of course, any number of well known exhaust manifolds 308 may be implemented as well.

Although the foregoing invention has been described in some detail for purposes of clarity of understanding, it will be apparent that certain changes and modifications may be practiced within the scope of the appended claims. By way of example, the structure and methodology described herein may be used to provide superior coating uniformities on square substrates such as mask plates, liquid crystal display panels and multi-hip carrier modules. Accordingly, the present embodiments are to be considered as illustrative and not restrictive, and the invention is not to be limited to the details given herein, but may be modified within the scope and equivalents of the appended claims.

What is claimed is:

1. A chemical applicator for spin coating chemicals over a surface of a substrate, comprising:

a bowl for supporting a substrate, the bowl having a plurality of drain holes defined below the level of the substrate;

a lid having a flat surface configured to lie a predetermined distance of between about 1 mm and 10 mm above the substrate and mate with the bowl; and a plurality of injection holes defined in the bowl for applying a solvent to an underside of the substrate.

2. A chemical applicator for spin coating chemicals over a surface of a substrate as recited in claim 1, wherein the plurality of injection holes are arranged in a ring, the ring being coupled to a solvent injection ring that is configured to receive the liquid solvent that is to be applied near an outer radius of the underside of the substrate.

3. A chemical applicator for spin coating chemicals over a surface of a substrate as recited in claim 2, wherein the ring has an internal surface that is spaced apart from the underside of the substrate.

4. A chemical applicator for spin coating chemicals over a surface of a substrate as recited in claim 1, further comprising a locking shaft for mechanically applying the lid over the bowl, and the locking shaft being configured to secure the lid to the bowl during a spin coating process.

5. A chemical applicator for spin coating chemicals over a surface of a substrate as recited in claim 4, wherein the bowl includes a plurality of pins that are configured to mate and secure the lid to the bowl.

6. A chemical applicator for spin coating chemicals over a surface of a substrate as recited in claim 4, wherein the lid has a hollow internal region that is configured to receive the locking shaft.

7. A chemical applicator for spin coating chemicals over a surface of a substrate as recited in claim 1, wherein the predetermined distance is between about 2 mm and about 10 mm.

8. A chemical applicator for spin coating chemicals over a surface of a substrate as recited in claim 1, wherein the predetermined distance is between about 2 mm and about 4 mm.

9. A chemical applicator for spin coating chemicals over a surface of a substrate as recited in claim 1, wherein the bowl is secured in a catch cup having a draining system and an exhaust system.

10. A chemical applicator for spin coating chemicals over a surface of a substrate as recited in claim 9, wherein the catch cup includes a first splash ring configured to sit over a top portion of the catch cup.

11. A chemical applicator for spin coating chemicals over a surface of a substrate as recited in claim 10, wherein the catch cup includes a second splash ring that is configured to mate with the first splash ring, the second splash ring further being configured to substantially retain particulates exiting the plurality of drain holes within the catch cup.

12. A chemical applicator for spin coating chemicals over a surface of a substrate as recited in claim 1, wherein the substrate is a semiconductor wafer.

13. A spinning chemical applicator for spin coating a work piece, comprising:

a bowl for holding the work piece;

a lid mounted on a top surface of the bowl such that an inner lid surface is space apart from the work piece by a range between about 1 mm and 10 mm;

a plurality of lower drain holes being defined along an outer circumference of bowl; and a plurality of injecting holes, the plurality of injecting holes each have a first end located under the bowl on an outer surface, and each of the plurality of injecting holes have a corresponding second end located on an inner surface of the bowl such that the first end and the second end are connected to define a path.

14. A spinning chemical applicator for spin-coating a work piece as recited in claim 13, wherein the first end of the plurality of injection holes is located at a first radial distance that is less than a second radial distance of the second end of the plurality of injection holes.

15. A spinning chemical applicator for spin-coating a work piece as recited in claim 14, wherein the plurality of drain holes provide a drain path leading from the plurality of injector holes.

16. A spinning chemical applicator for spin-coating a work piece as recited in claim 14, wherein the plurality of drain holes are defined substantially near a lower portion of the bowl.

17. A spinning chemical applicator for spin-coating a work piece as recited in claim 14, wherein the plurality of injector holes are vertically lower and spaced apart from the workpiece.

18. A spinning chemical applicator for spin-coating a work piece as recited in claim 14, wherein the bowl contains a vacuum channel for securing the work piece to the bowl.

19. A spinning chemical applicator for spin-coating a work piece as recited in claim 18, wherein vacuum channel is connected to a vacuum pump.

20. A spinning chemical applicator for spin-coating a work piece as recited in claim 13, wherein the lid encapsulates the bowl and workpiece.

21. A spinning chemical applicator for spin-coating a work piece as recited in claim 13, wherein the lid contains a plurality of pin holes configured to mate with a plurality of pins defined on a top lip of the bowl.

22. A spinning chemical applicator for spin-coating a work piece as recited in claim 13, wherein the work piece is a semiconductor wafer.

23. A method for spin coating a chemical over a substrate, comprising:

applying a chemical over a substrate;

enclosing the substrate in a closed bowl configured to hold the substrate;

spinning the closed bowl to cause the chemical to spread over a top surface of the substrate; and injecting a solvent into the closed bowl such that the injected solvent is applied at an under surface of the substrate while the closed bowl is spinning, the injected solvent being configured to reduce an edge beading of the chemical applied over the substrate.

24. A method for spin coating a chemical over a substrate as recited in claim 23, further comprising:

dissolving the chemical beading formed over the top surface of the substrate when the solvent injected at the under surface of the substrate contacts the chemical beading.

25. A method for spin coating a chemical over a substrate as recited in claim 24, wherein the dissolving of the chemical beading produces a substantially uniform chemical coating over the top surface of the substrate.

26. A method for spin coating a chemical over a substrate as recited in claim 25, wherein the spinning of the closed bowl assists in injecting the solvent through a plurality of injecting holes defined in an underside of the closed bowl.

* * * * *